United States Patent
Aswell et al.

(10) Patent No.: US 6,943,721 B1
(45) Date of Patent: Sep. 13, 2005

(54) CHARGE-COUPLED AMPLIFIER AND CONVERTER WITH MATCHED OFFSETS

(75) Inventors: Cecil J. Aswell, Organgevale, CA (US); Eugene G. Dierschke, Dallas, TX (US); John Hull Berlien Jr., Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/333,849

(22) Filed: Jun. 15, 1999

Related U.S. Application Data

(60) Provisional application No. 60/089,330, filed on Jun. 15, 1998.

(51) Int. Cl.[7] ................................. H03M 1/12

(52) U.S. Cl. .................. 341/172; 341/155; 341/150

(58) Field of Search ................. 341/172, 132, 341/155, 156, 158, 150, 118

(56) References Cited

U.S. PATENT DOCUMENTS

| | | | | |
|---|---|---|---|---|
| 4,907,084 A | * | 3/1990 | Nagafusa | 348/691 |
| 5,027,117 A | * | 6/1991 | Yoshida et al. | 341/132 |
| 5,387,986 A | * | 2/1995 | Gerhart | 358/452 |
| 5,513,018 A | * | 4/1996 | Nisimura | 358/474 |
| 5,708,471 A | * | 1/1998 | Okumura | 348/301 |
| 5,757,440 A | * | 5/1998 | Mangelsdorf | 340/573.4 |
| 5,796,361 A | * | 8/1998 | Levinson | 341/172 |

* cited by examiner

*Primary Examiner*—John B Nguyen
(74) *Attorney, Agent, or Firm*—Alan K. Stewart; W. James Brady, III; Frederick J. Telecky, Jr.

(57) ABSTRACT

An linear optical sensor charged-coupled topology using single-stage inverting charge-coupled amplifier driving an analog-to-digital converter which uses the converter full-scale reference as a precharge level. Since an offset in the range of 100–200 mV is introduced in the charge amplifier, a corresponding offset is also introduced into the ADC to allow the amplifier to more quickly drive the amplifier output to a low level. The converter offset is proportional to the converter reference to ensure that it is controlled and tracks the reference.

25 Claims, 6 Drawing Sheets

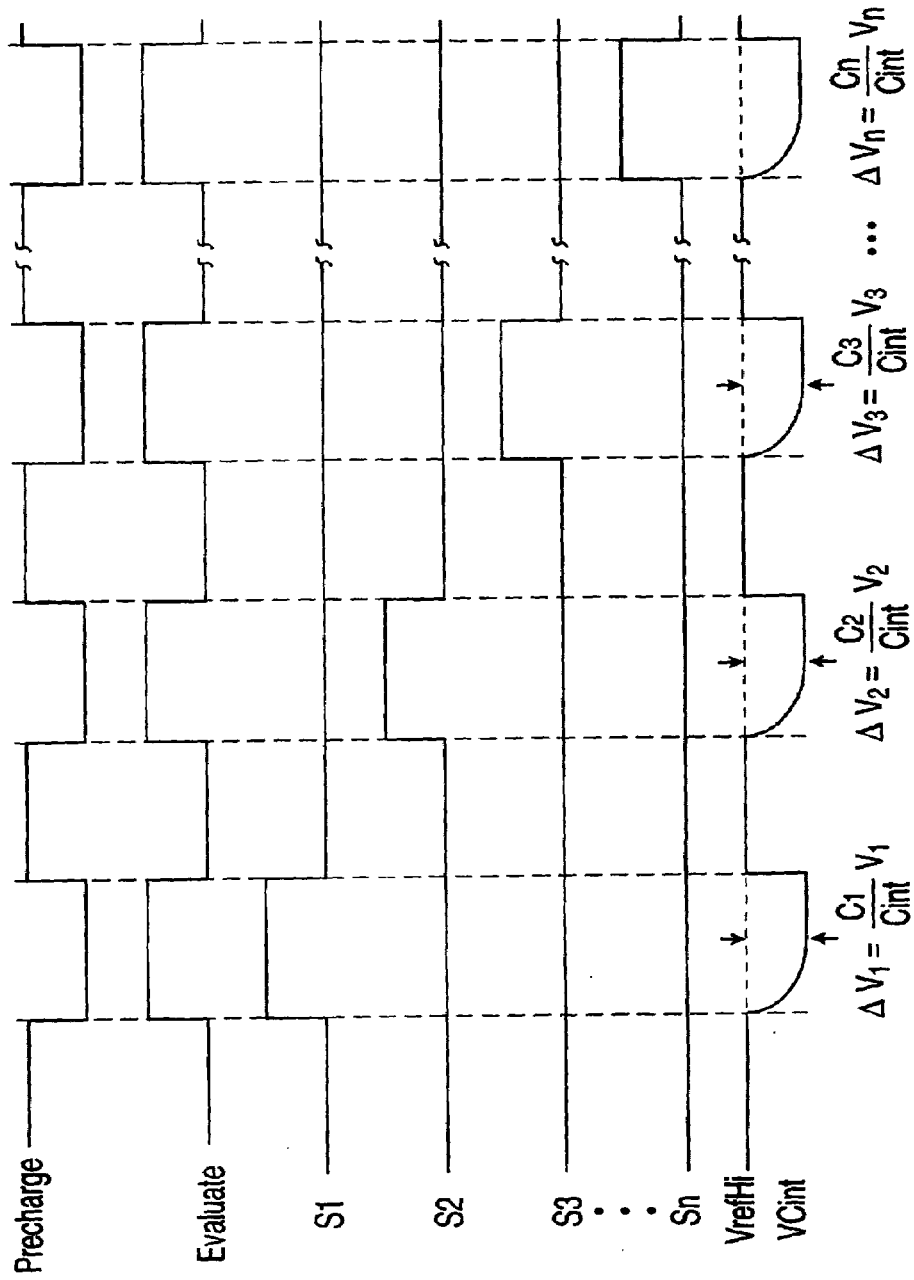

CHARGE-COUPLED AMPLIFIER AND CONVERTER WITH MATCHED OFFSETS

Application is a continuation of provisional application No. 60/089,330 filed on Jun. 15, 1998.

BACKGROUND AND SUMMARY OF THE INVENTION

The present invention relates to integrated image sensor circuits, and more particularly to active integrator pixel architectures with on-board digital converters.

BACKGROUND: ACTIVE INTEGRATOR PIXEL ARCHITECTURES

The active integrator-per-pixel architecture is an effective technique for implementing high speed, high sensitivity linear optical arrays with analog outputs. An example of this architecture is found in the TSL1301 102×1 Linear Sensor Array with Hold, manufactured by Texas Instruments. (This integrated circuit and its data sheets are all hereby incorporated by reference.) The sensor array architecture is a key element in obtaining the desired speeds and sensitivities, and has been described in detail in prior commonly owned applications:

Ser. No. 09/002,731, filed Jan. 1, 1998;

Ser. No. 09/002,904, filed Jan. 1, 1998; and

Ser. No. 09/002,639, filed Jan. 1, 1998);

all of which are hereby incorporated by reference. A feature of the TSL1301 architecture is that charges representative of the integrated photocurrent of each pixel are stored on capacitors. Current integrated over time defines a charge, so the pixel readout signals initially appear as a variable charge. Since this charge appears on a capacitor, it can be read out as a voltage which is referenced to chip ground; but there are some complications to optimally amplifying such a charge signal. Amplifiers for following such a charge signal are referred to as "charge-coupled" or charge detection amplifiers. Such amplifiers have often been used as output stages in CCD imagers, but the need for charge-coupled amplifiers extends beyond CCD imagers.

In a TSL1301 implementation, these capacitors are sequentially multiplexed into a charge-coupled output amplifier circuit so that a single serial analog output can be used to access the information from all the pixels in the array. This circuit used two inverting amplifiers so that the output increases with increasing signal. A single-supply amplifier cannot drive its output to ground quickly because the amplifier loses gain as the output nears ground.

To circumvent the output drive problem in this device, a constant offset (e.g. 100–200 mV typically) is introduced in the charge-coupled amplifier. This offset must either be clamped with external circuitry, or be otherwise removed in subsequent signal processing. The charge-coupled topology used in the prior art is neither effective nor efficient for driving on-board ADCs for a multiplicity of reasons. First, the offset would subtract from the dynamic range of a ground-referenced ADC. Second, a two-stage charge-coupled converter consumes more area than the disclosed invention. Finally, a two-stage charge-coupled converter is more limited with regard to settling time.

The present application discloses an amplifier configuration in which a single-stage inverting charge-coupled amplifier, which drives an analog-to-digital converter ("ADC"), uses the ADC's full-scale reference as a precharge level. In some embodiments the ADC's low reference is above ground, so that the single-stage amplifier is not required to drive its output to zero volts in order to achieve a fill scale range on the ADC. Thus, the innovative charge-to-voltage architecture is optimized for analog-to-digital conversion. With no charge input (corresponding to zero voltage on the sampling capacitor being converted), the one's complement output of the ADC is zero.

This architecture permits a higher throughput than the prior-art circuits, is more area efficient, and permits offset cancellation in the charge-to-voltage converters.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 3 shows waveforms at selected nodes of the amplifier.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

PREFERRED EMBODIMENT

Figure 1A:
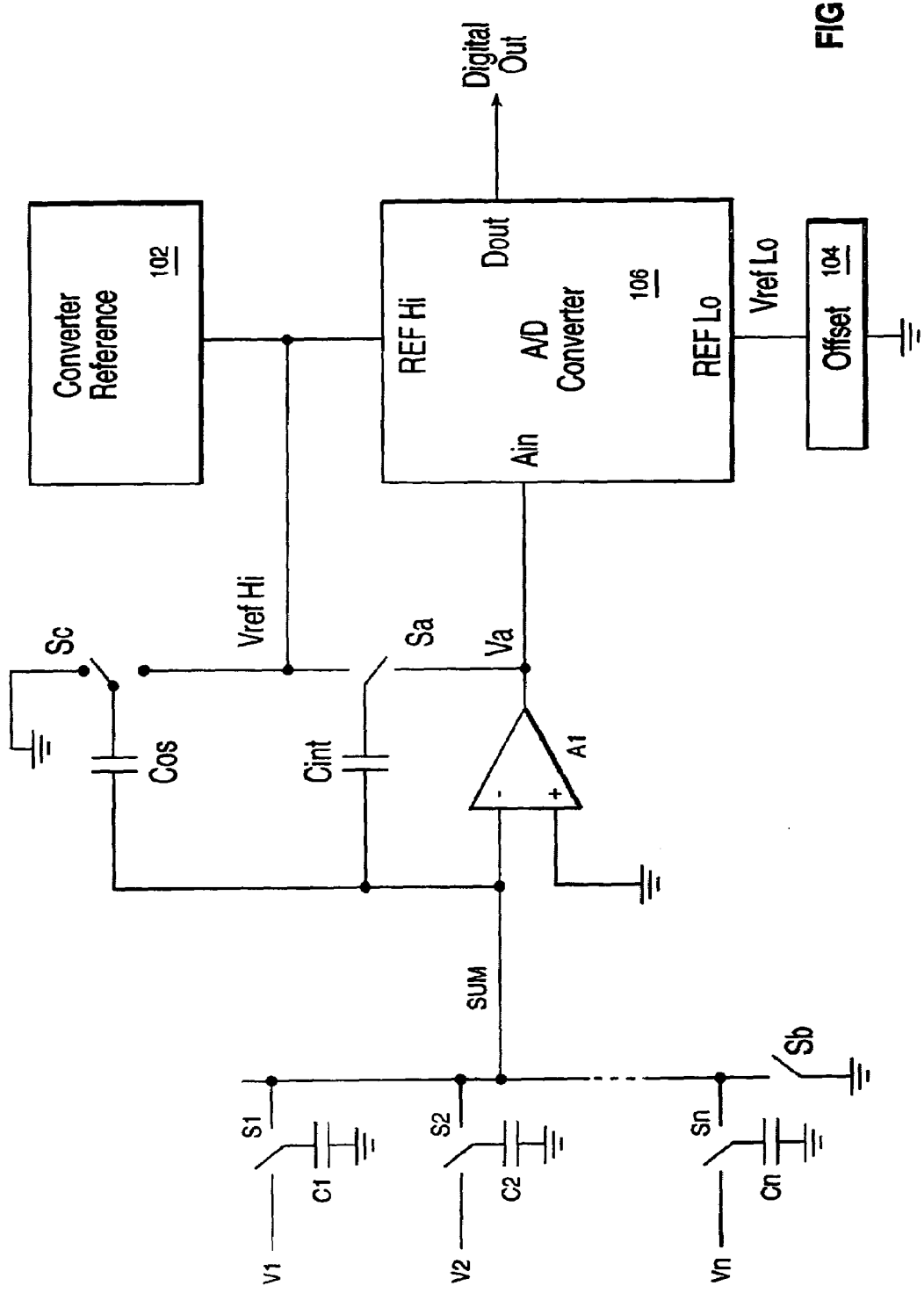
FIG. 1A shows a circuit block diagram of a preferred embodiment.

FIG. 1A is a simplified block diagram of the invention. Input voltages V1, V2 . . . . Vn are the outputs of pixel integrators fixed in an array. (Linear arrays may have hundreds of pixels, and area arrays may have far more.) Capacitors C1, C2, . . . . Cn are sampling capacitors. Amplifying element A1 is a high gain, high speed operational amplifier with a switched integrator feedback capacitor Cint. The converter reference 102 is a stable voltage reference source (e.g. a bandgap reference). The offset circuitry 104 represents a voltage source that is a fixed fraction of the converter reference voltage 102. (Making the offset 104 proportional to the reference 102 assures that the offset is controlled and tracks the reference voltage.) The ADC 106 digitizes the voltage Va present at ADC input Ain, with a zero code representing Va equal to VrefLo, and a full scale code representing Va input equal to VrefHi. (Note that a simple one's complement (all bits inverted) reverses the sense of the converter. That is, a zero code can be generated with an input of VrefHi, and a full scale output can be generated with an input of VrefLo.) Note that by setting the VrefLo to a positive voltage above ground, amplifier A1 is not required to drive the output to zero volts in order to achieve a full scale range on the ADC. In operation, voltages V1, V2 . . . Vn are typically simultaneously sampled on the corresponding capacitors C1, C2 . . . Cn through switches S1, S2, . . . . Sn. To start a conversion cycle, switch Sa is put in the upper position (VrefHi), switch Sc is put in the lower position to contact VrefHi, and switch Sb is closed. This precharges capacitor Cint and capacitor Cos to VrefHi. Next, in the evaluation phase, switch Sb is then opened, switch Sa is switched to the lower position to contact Va, switch Sc is switched to the upper position to contact ground, and concurrently switch S1 is connected to the SUM node. Assuming non-overlapping switches, the voltage Va on the output of amplifying element A1 will settle to the voltage Va=VrefHi−(V1*C1−Cos*VRefHi)/Cint. (By reversing the polarity of switch Sc, the opposite polarity can be achieved.) Voltage Va is then converted by the ADC, and the digital representation of Va is present at the digital output Dout. The cycle repeats using capacitor C2 and switch S2, until all pixel voltages V1, V2 . . . . Vn have been converted. In addition, note that the gain from the integrator to the ADC input Ain can be varied globally by varying the size of the integrator capacitor Cint. The gain can be incrementally adjusted with trim-at-probe techniques or with other programming means.

TSL2301 Product Implementation

Figure 2:
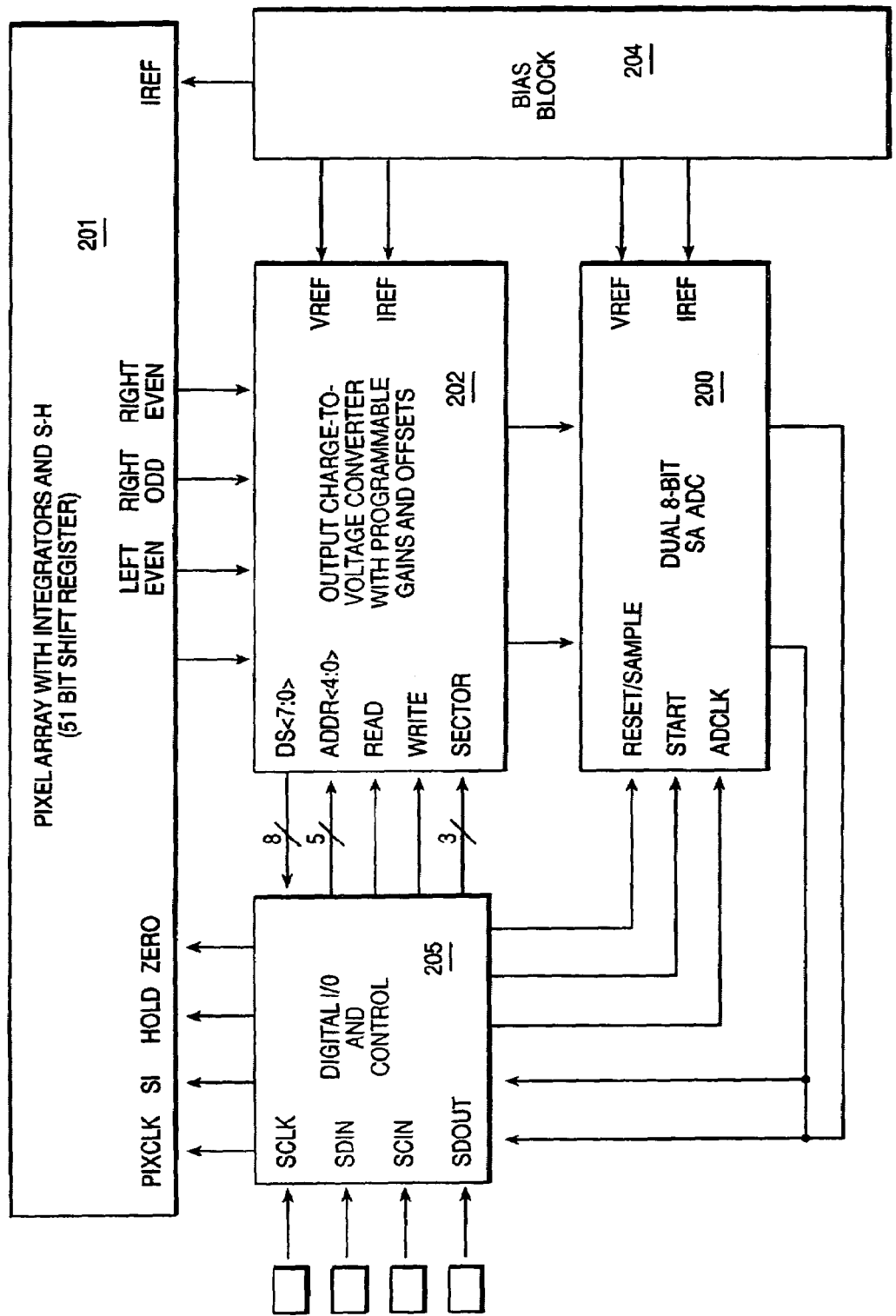
FIG. 2 shows a current product implementation of the preferred embodiment.

FIG. 2 shows a current product implementation of the preferred embodiment. The innovative control technique is currently being implemented in the TSL2301 Linear Optical Sensor Array manufactured by Texas Instruments. The TSL2301 is a linear (102×1) 300 dpi optical sensor array with an integrated 8-bit ADC 200, and is intended for high performance scanner applications. Light energy impinging on a photodiode of a pixel of the optical array generates photocurrent, which is then integrated by active integration circuitry associated with that pixel. During the integration period, a sampling capacitor connects to the output of the active integrator through an analog switch. A multiplicity of matched capacitors provide voltages which are multiplexed through the analog switch. The amount of charge accumulated at each pixel is directly proportional to the light intensity on that pixel and to the integration time. Integration, sampling, output, and reset of the integrators are controlled by the control logic 205 in response to commands input via the SDIN connection. Reading the pixels causes the sampled value of each pixel to be converted to an 8-bit digital format and output on the SDOUT pin. The ADC 200 has a high-speed sampling circuit such that the next precharge/evaluation cycle of the charge-coupled amplifier can take place during analog-to-digital conversion. The charge-coupled amplifier A1 located in the charge-to-voltage converter 202 is precharged to the ADC reference so that with no charge input (corresponding to zero voltage on the sampling capacitor being converted), the one's complement output of the converter is zero. The amplifier A1 is also autozeroed during the precharge cycle. The TSL2301 also comprises a 5-bit gain register and an 8-bit offset register. Voltage and current biases are provided to the array 201, the ADC 200, and the charge-to-voltage converter circuitry 202 by an bias circuit 204. Offset correction is performed in the analog domain prior to digital conversion. An offset voltage applied to the ADC and proportional to the ADC reference is used so that the driving amplifier does not have to drive to zero volts to utilize the full input range of the ADC. (Note that this offset has nothing to do with the offset digital-to-analog converter ("DAC") used to correct for offsets of V1, V2, . . . Vn from the pixel electronics.) The pixel array 201 is divided into 3 zones of 34 pixels each. There is a separate offset DAC for each of the three zones for correcting dark signal levels. A programmable gain amplifier is used for convenient amplifier control. A separate gain DAC for the programmable gain amplifier is used for each of the three zones. Data communication is accomplished through a three-wire serial interface.

Figure 4A:
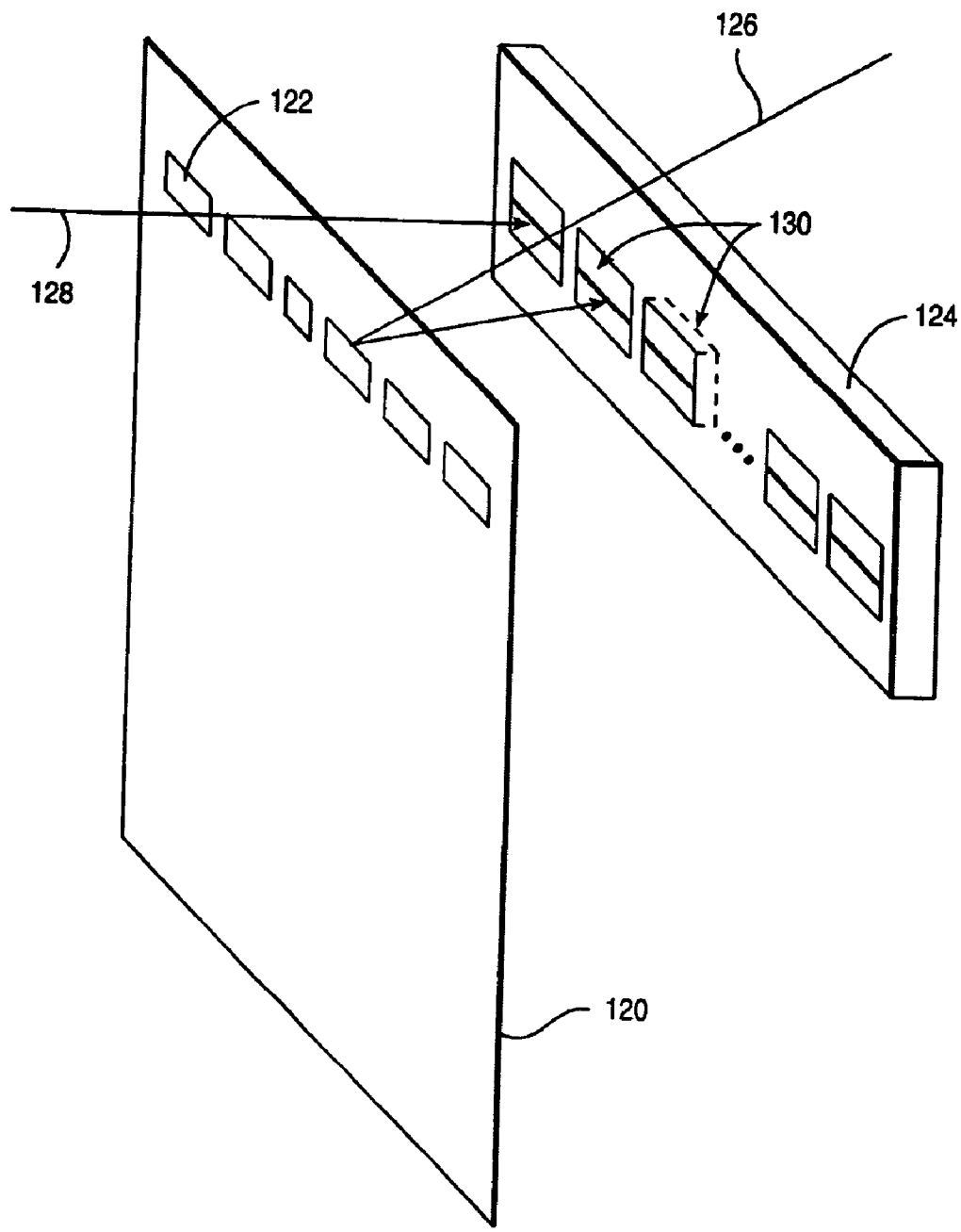
FIG. 4A shows an implementation of the preferred embodiment in a scanner.

FIG. 4A shows an implementation of the preferred embodiment in a scanner. A piece of paper 120 containing markings 122 is being scanned by a scanner 124. The scanner 124 may be, for example, be a small scanning system comprising a single chip, a handheld scanner comprising a small number of chips, or even a larger scanner comprising a large number of chips used for larger image scanning jobs. Light energy 128 may be projected through the markings 122 on the paper, or perhaps reflected light 126 may be used to illuminate the markings 122 for detection by the sensors 130 of the scanner 124. In this particular embodiment, the scanner 124 may comprise a number of sensor chips 130 placed linearly in a single row. Other configurations may be employed where several rows of sensor chips 130 may be used to perform the scanning operation.

Figure 4B:
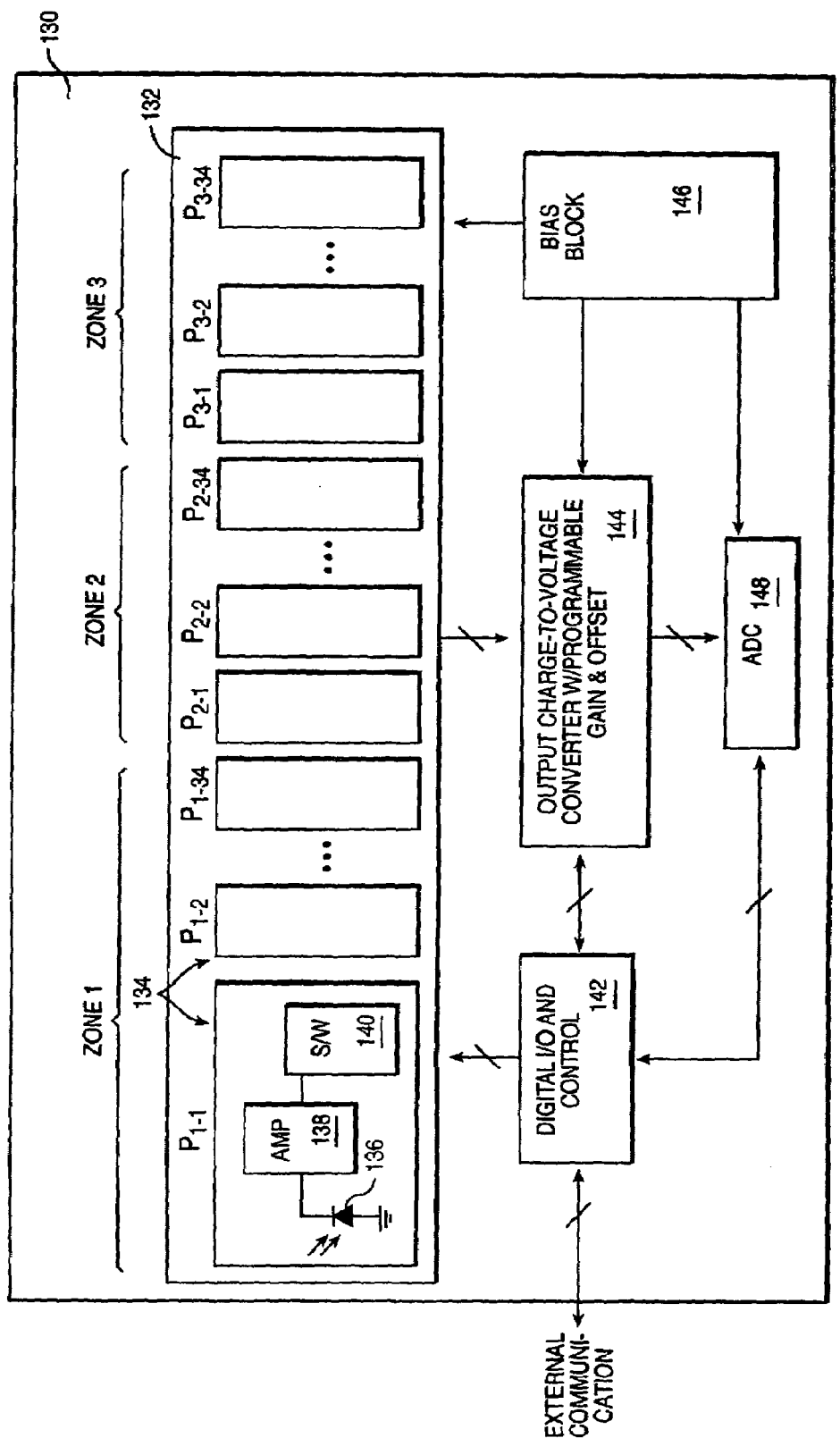
FIG. 4B shows a block diagram of a sensor chip used in the scanner of FIG. 4A.

FIG. 4B shows a block diagram of a sensor chip used in the scanner of FIG. 4A. The chip 130 comprises, in this embodiment, a 102×1 linear array 132 of pixels 134 (Px-y, where x=zone, y= pixel of the respective zone). The array 132 is divided into three zones of 34 pixels each. Zone 1 contains 34 pixels designated P1-1 to P1-34, Zone 2 comprises 34 pixels designated P2-1 to P2-34, and Zone 3 comprises 34 pixels designated P3-1 to P3-34. Each pixel 134 comprises a photosensor 136, a charge integrator/amplifier 138, and a sample-hold circuit 140. The chip 130 also includes additional support circuitry for controlling and processing the photo signals. The digital I/O and control circuitry 142 provides a three-wire serial interface to external communications and also control function for all onboard-circuits. A charge-to-voltage converter circuit 144 receives the pixel signal and conditions the signal for the ADC 148. It also provides a programmable gain and offset capability for each pixel zone. A bias block 146 provides voltage biasing for the pixel array circuitry 132, the ADC circuitry 148, and the charge-to-converter circuitry 144.

Waveforms at Selected Nodes

FIG. 3 shows waveforms at selected nodes of the amplifier. When the precharge phase begins, switch Sb is closed, switch Sa is connected to VrefHi (precharging Cint to VrefHi), and switch Sc also connects to VrefHi (precharging Cos to VrefHi). Switch S1 is connected to the input voltage V1 charging capacitor C1. During the first evaluation phase (for the first charge-coupled circuit with capacitor C1), switch Sb is opened, switch Sa is connected to the ADC input voltage node Va, and switch Sc is connected to ground. Switch S1 is connected to the SUM node and the voltage Va settles to a value which is then digitized. The precharge and evaluation phases continue for all subsequent inputs S2 . . . Sn.

Other features and details which are also contemplated for use in the preferred embodiments, but which are not necessary for practice of the claimed inventions, are disclosed in the following co-pending applications:

Ser. No. 09/333,850—Optical Sensor Array With Zone-Programmable Gain and Offset"; and Ser. No. 09/334,205—"Addressing and Communication for Multiple-Chip Optical Sensor Arrays".

Both of these are commonly owned with the present application, and have effective filing dates which are simultaneous with that of the present application, and are herein incorporated by reference.

ALTERNATIVE EMBODIMENT: NO EXTRA SWITCH AND CAPACITOR

Figure 1B:
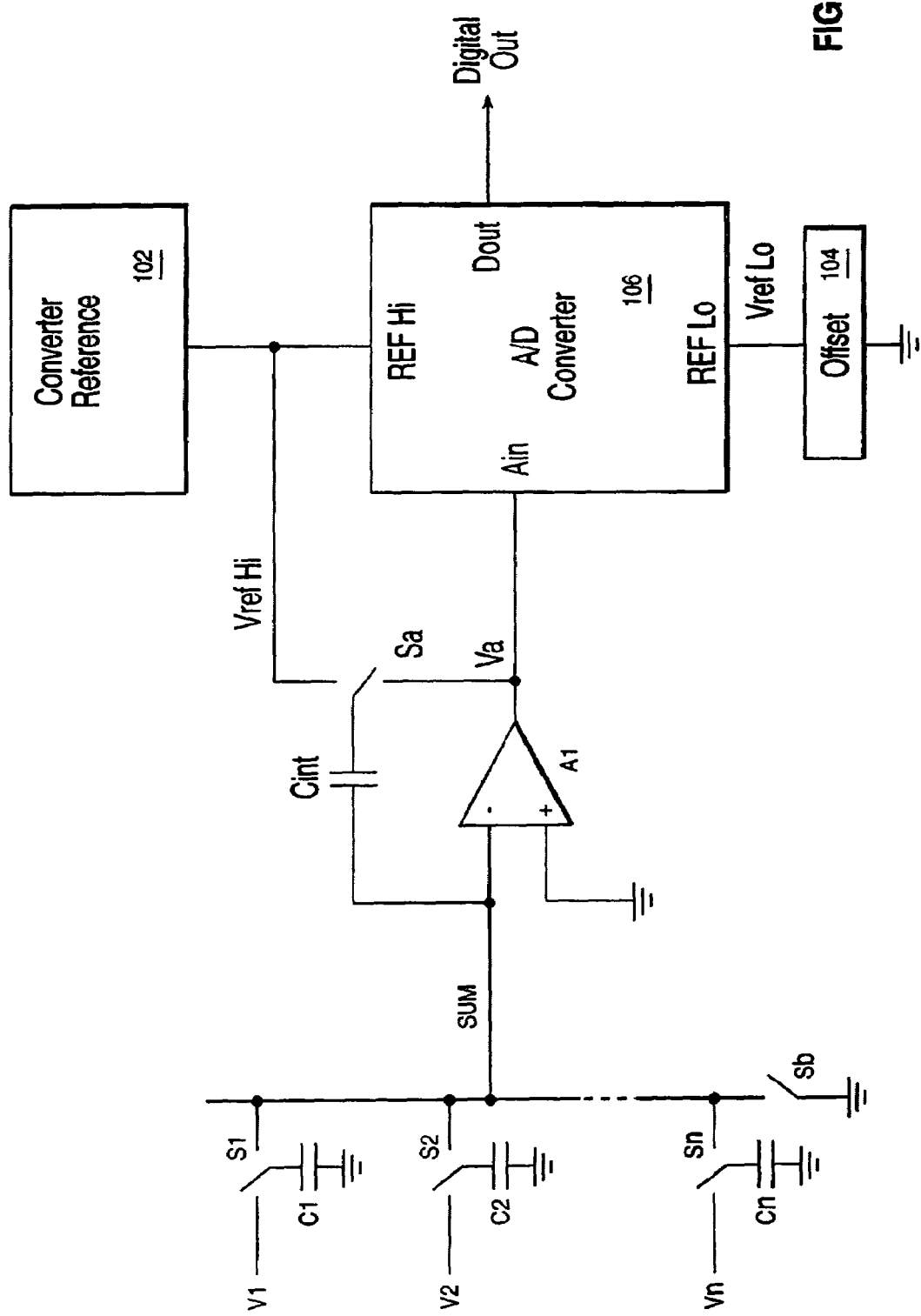
FIG. 1B shows an alternative embodiment of the circuit of FIG. 1A.

FIG. 1B shows an alternative embodiment of the circuit of FIG. 1A. In this embodiment, switch Sc and capacitor Cos are not used. To start a conversion cycle, switch Sa is put in the upper position, contact VrefHi, and switch Sb is closed. This precharges capacitor Cint to VrefHi. Next, switch Sb is then opened, switch Sa is switched to the lower position to contact Va, and concurrently switch S1 is connected to the SUM node. Assuming non-overlapping switches, the voltage Va on the output of amplifying element A1 will settle to the voltage Va=VrefHi−(V1*C1)/Cint. Voltage Va is then converted by the ADC, and the digital representation of Va is present at the digital output Dout. Capacitor Cint is a programmable capacitor DAC controlled by the gain and offset registers. Then only the part of the V1 signal due to light response will be inputted into the ADC 106.

ALTERNATIVE EMBODIMENT: AREA IMAGE SENSORS

According to a class of innovative embodiments, the disclosed innovative technique is not limited to linear array sensors, but is also applicable to area array image sensors.

According to a disclosed class of innovative embodiments, there is provided: a charge-coupled amplifier circuit, consisting of:

an analog-to-digital converter which uses a first voltage as a first reference to convert an analog input to a digital output, and which is also connected to receive a second reference voltage; and a single-stage inverting amplifier which is connected to receive charge-coupled inputs, and to amplify said inputs with reference to said second voltage, and to drive said analog input accordingly.

According to another disclosed class of innovative embodiments, there is provided: an optical sensor array integrated circuit, comprising: an array of photosensitive elements for sensing light energy; and a charge-coupled amplifier circuit, consisting of an analog-to-digital converter which uses a first voltage as a first reference to convert an analog input to a digital output, and which is also connected to receive a second reference voltage; and a single-stage inverting amplifier which is connected to receive charge-coupled inputs, and to amplify said inputs with reference to said second voltage, and to drive said analog input accordingly.

According to another disclosed class of innovative embodiments, there is provided: a method for converting multiple single-ended ground-referenced charge signals to a digital representation, comprising the steps of: (a.) converting an analog input to a digital output using an analog-to-digital converter which is referenced to a first voltage, and which is also connected to receive a second reference voltage; and (b.) connecting a single-stage inverting amplifier to receive charge-coupled inputs, and to amplify said charge-coupled inputs with reference to said second voltage, and to drive said analog input accordingly.

According to another disclosed class of innovative embodiments, there is provided: a method for digitizing charge-coupled inputs in an optical sensor array, comprising the steps of: (a.) connecting one or more charge-coupled inputs from an array of photosensitive elements used for sensing light energy; and (b.) amplifying said charge-coupled inputs with an amplifier circuit, said amplifier circuit consisting of, an analog-to-digital converter which uses a first voltage as a first reference to convert an analog input to a digital output, and which is also connected to receive a second reference voltage; and a single-stage inverting amplifier which is connected to receive said charge-coupled inputs, and to amplify said inputs with reference to said second voltage, and to drive said analog input accordingly.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, within the constraints well-known to those of ordinary skill, the disclosed innovative technique is not restricted to for linear arrays, but may also be applied to area arrays.

What is claimed is:

1. A charge-coupled amplifier circuit, consisting of:
   an analog-to-digital converter which uses a first voltage as a first reference to convert an analog input to a digital output, and which is also connected to receive a second reference voltage; and
   a single-stage inverting amplifier which is connected to receive charge-coupled inputs, and to amplify said inputs with reference to said second voltage, and to drive said analog input accordingly.

2. The circuit of claim 1, wherein said first and second voltages both differ from ground.

3. The circuit of claim 1, wherein said first voltage differs from ground by a predetermined offset value.

4. The circuit of claim 1, wherein said inverting amplifier is autozeroed during a precharge phase.

5. The circuit of claim 1, wherein said inverting amplifier is a programmable gain amplifier.

6. The circuit of claim 1, wherein said first voltage is proportional to said second reference voltage.

7. The circuit of claim 1, wherein said inverting amplifier is a single supply, charge-coupled operational amplifier.

8. The circuit of claim 1, wherein said charge-coupled inputs are supplied by a multiplicity of matched capacitors.

9. The circuit of claim 1, wherein the voltages at respective said charge-coupled inputs are provided by corresponding outputs of active integrators connected to photosensitive elements.

10. An optical sensor array integrated circuit, comprising:
    an array of photosensitive elements for sensing light energy; and
    a charge-coupled amplifier circuit, consisting of
    an analog-to-digital converter which uses a first voltage as a first reference to convert an analog input to a digital output, and which is also connected to receive a second reference voltage; and a single-stage inverting amplifier which is connected to receive charge-coupled inputs, and to amplify said inputs with reference to said second voltage, and to drive said analog input accordingly.

11. The circuit of claim 10, wherein said first voltage differs from ground by a predetermined offset value.

12. The circuit of claim 10, wherein said inverting amplifier is autozeroed during a precharge phase.

13. The circuit of claim 10, wherein the voltages at respective said charge-coupled inputs are provided by corresponding outputs of active integrators connected to said photosensitive elements.

14. The circuit of claim 10, wherein said array is a substantially linear array.

15. A method for converting multiple single-ended ground-referenced charge signals to a digital representation, comprising the steps of:
- (a.) converting an analog input to a digital output using an analog-to-digital converter which is referenced to a first voltage, and which is also connected to receive a second reference voltage; and
- (b.) connecting a single-stage inverting amplifier to receive charge-coupled inputs, and to amplify said charge-coupled inputs with reference to said second voltage, and to drive said analog input accordingly.

16. The method of claim 15, wherein said first voltage differs from ground by a predetermined offset value.

17. The method of claim 15, wherein said inverting amplifier is autozeroed during a precharge phase.

18. The method of claim 15, wherein said inverting amplifier is a programmable gain amplifier.

19. The method of claim 15, wherein the voltages at said respective charge-coupled inputs are provided by corresponding outputs of active integrators connected to said photosensitive elements.

20. A method for digitizing charge-coupled inputs in an optical sensor array, comprising the steps of:
- (a.) connecting one or more charge-coupled inputs from an array of photosensitive elements used for sensing light energy; and
- (b.) amplifying said charge-coupled inputs with an amplifier circuit, said amplifier circuit consisting of
  - an analog-to-digital converter which uses a first voltage as a first reference to convert an analog input to a digital output, and which is also connected to receive a second reference voltage; and
  - a single-stage inverting amplifier which is connected to receive said charge-coupled inputs, and to amplify said inputs with reference to said second voltage, and to drive said analog input accordingly.

21. The method of claim 20, wherein said first voltage differs from ground by a predetermined offset value.

22. The method of claim 20, wherein said inverting amplifier is autozeroed during a precharge phase.

23. The method of claim 20, wherein said inverting amplifier is a programmable gain amplifier.

24. The method of claim 20, wherein the voltages at respective said charge-coupled inputs are provided by corresponding outputs of active integrators connected to said photosensitive elements.

25. The method of claim 20, wherein said array is a substantially linear array.

* * * * *